United States Patent
Xue et al.

(10) Patent No.: US 8,722,468 B2
(45) Date of Patent: May 13, 2014

(54) SEMICONDUCTOR ENCAPSULATION METHOD

(71) Applicant: Alpha and Omega Semiconductor Incorporated, Sunnyvale, CA (US)

(72) Inventors: Yan Xun Xue, Los Gatos, CA (US); Anup Bhalla, Santa Clara, CA (US); Jun Lu, San Jose, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/950,666

(22) Filed: Jul. 25, 2013

(65) Prior Publication Data

US 2013/0309816 A1    Nov. 21, 2013

Related U.S. Application Data

(62) Division of application No. 12/846,034, filed on Jul. 29, 2010, now Pat. No. 8,519,525.

(51) Int. Cl.
 *H01L 21/00* (2006.01)
(52) U.S. Cl.
 USPC .... 438/123; 438/106; 438/121; 257/E23.031; 257/E23.043
(58) Field of Classification Search
 USPC ......... 257/666, 667, 672, 676, 723, 773, 784, 257/E23.031, E23.037, E23.039, E23.043; 438/106, 111, 112, 121, 123
 See application file for complete search history.

(56) References Cited

U.S. PATENT DOCUMENTS

| | | | |
|---|---|---|---|
| 7,235,876 B2 | 6/2007 | Okumura et al. | |
| 2005/0056916 A1* | 3/2005 | Sakamoto et al. | 257/672 |
| 2006/0035414 A1 | 2/2006 | Park et al. | |
| 2006/0151889 A1 | 7/2006 | Kajiwara et al. | |
| 2007/0052070 A1 | 3/2007 | Islam et al. | |
| 2007/0145580 A1* | 6/2007 | Satou et al. | 257/723 |
| 2007/0228534 A1 | 10/2007 | Uno et al. | |
| 2010/0301464 A1* | 12/2010 | Arshad | 257/676 |
| 2011/0111562 A1* | 5/2011 | San Antonio et al. | 438/113 |

FOREIGN PATENT DOCUMENTS

CN    101697348 A    4/2010

\* cited by examiner

*Primary Examiner* — Eduardo A Rodela
(74) *Attorney, Agent, or Firm* — Chein-Hwa Tsao; CH Emily LLC (57) ABSTRACT

A semiconductor encapsulation comprises a lead frame further comprising a chip carrier and a plurality of pins in adjacent to the chip carrier. A plurality of grooves opened from an upper surface of the chip carrier partially dividing the chip carrier into a plurality of chip mounting areas. A bottom portion of the grooves is removed for completely isolate each chip mounting area, wherein a width of the bottom portion of the grooves removed is smaller than a width of the grooves. In one embodiment, a groove is located between the chip carrier and the pins with a bottom portion of the groove removed for isolate the pins from the chip carrier, wherein a width of the bottom of the grooves removed is smaller than a width of the grooves.

11 Claims, 9 Drawing Sheets

Step 1: providing a lead frame comprising a chip carrier and a plurality of pins with a groove partially dividing the chip carrier into first and second chip mounting areas Step 2: disposing first and second semiconductor chips having a bottom electrode and a plurality of top electrodes on the first and second chip mounting areas respectively Step 3: providing a first metal clip with first end connecting a top electrode of the first semiconductor chip and second end disposed inside the first groove Step 4: providing a plastic encapsulating Step 5: removing a bottom of the first groove so as to electrically isolate the first chip mounting area from the second chip mounting area

Step 1: providing a lead frame with a groove partially dividing the chip carrier and the pins Step 2: mounting a semiconductor chips on the chip carrier Step 3: providing a metal connection connecting a top electrode of the chip to the pins Step 4: providing a plastic encapsulating Step 5: removing a bottom of the groove so as to electrically isolate the pins from the chip carrier

Fig. 17

SEMICONDUCTOR ENCAPSULATION METHOD

PRIORITY CLAIM

This application is a divisional application of and claims the priority benefit of a U.S. patent application Ser. No. 12/846,034 filed Jul. 29, 2010, the entire disclosures of which are incorporated herein by reference.

TECHNICAL FIELD

This invention relates to a semiconductor encapsulation and method thereof, in particular to a power semiconductor encapsulation and method thereof.

BACKGROUND TECHNOLOGIES

Encapsulation is of vital importance to power semiconductor chips, which not only plays the role of protecting the chips and enhancing the heat conduction performances, but also provides an interface to communicate the internal worlds of the chips with external circuits. Currently continuous increasing scale of chip manufacture as well as the tremendous and rapidly growing electronic device market drives the growth of the semiconductor encapsulation industry. In order to meet the demands of light weight and compact products, various encapsulation structures are renewed; wherein chip encapsulation methods capable of satisfying the light weight and compact as well as high current density requirement receive more serious considerations.

Figure 1:
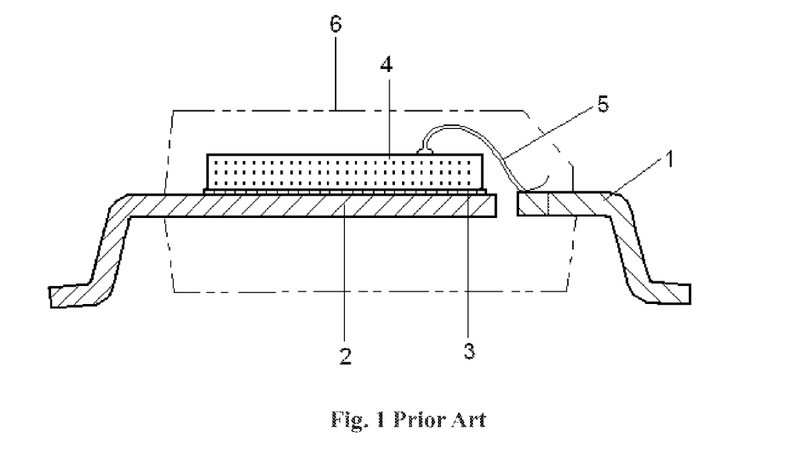
FIG. 1 is a cross-sectional view of a current semiconductor encapsulation structure.

As shown in FIG. 1, the existing encapsulation of a power semiconductor chip includes pins 1, chip carrier 2, bonding adhesive 3, chip 4, bond wire 5 and a plastic package body 6; wherein the chip carrier 2 and the pins are disconnected at the beginning of the encapsulation process where a gap is kept between the chip carrier 2 and the pins 1. During the encapsulation process of the chip, the chip carrier 2 and the pins 1 are arranged on chip mounting equipment. The bonding adhesive is disposed on the chip carrier 2, and then the chip 4 is pressed on the bonding adhesive 3. The squeezing effect of the chip 4 to the bonding adhesive 3 causes aggravation of the bonding adhesive 3 to overflow to the surrounding area of the chip 4, and the bonding adhesive 3 could even drip down onto the chip mounting equipment from the gap between the chip carrier 2 and the pins 1 to contaminate the chip mounting equipment.

Figures 2A, 2B:
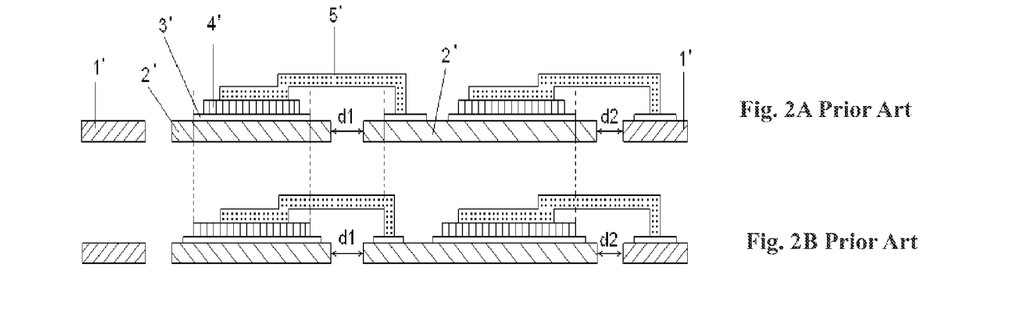
FIG. 2A-2C are the cross-sectional views of current semiconductor encapsulation structure with multiple chips co-package for explaining limitation on a chip size in prior art.
Figure 2C:
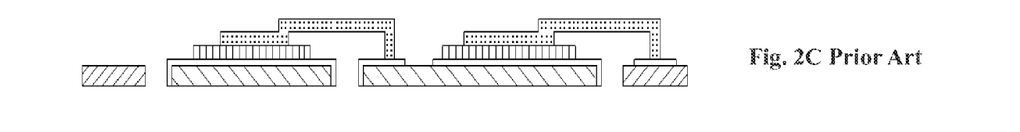

In the existing art of multiple chips co-package, at the beginning of encapsulation process, the chip mounting areas are disconnected from each other in addition to the fact that the chip carrier and the pins are disconnected. A gap is kept between the chip mounting areas. FIG. 2A-2C are schematic cross sections of a metal clip semiconductor encapsulation with multiple chips in prior art. The structure comprises pins 1', chip carrier 2' with two chip mounting areas, bonding adhesive 3', chips 4' and connection metal clips 5'. As shown in FIG. 2A a gap d1 is kept between the chip mounting areas of chip carrier 2' and a gap d2 is also kept between the chip carriers 2' and the pins 1'. As shown in FIG. 2B, when the size of the chips 4' is increased with the chip carriers 2' remains the same size, the bonding adhesive 3' below the chips 4' could overflow to the edges of the chip carrier 2'. As shown in FIG. 2C, the bonding adhesive 3' could even flow into the gap between the chip carriers 2', as well as the gap between the chip carriers 2' and the pins 1' to contaminate the chip mounting equipment. Therefore, during actual manufacturing process, in order to avoid the contamination on the chip mounting equipment caused by the overflowing of the bonding adhesive, mounting distance margin requirements are regulated based on different bonding adhesive, representing reducing the area of the chips under the premise of a set encapsulation size, or increasing the encapsulation size under the premise of a fix chip areas. However, the measure greatly reduces the utilization rate of the chip size in the semiconductor encapsulation.

SUMMARY OF INVENTION

A primary goal of this invention is to provide a power semiconductor chip encapsulation structure and method that would effectively prevent contamination to the chip mounting equipment caused by the overflow of bonding adhesive when mounting the chips at the same time maximize the utilization rate of chip sizes in the encapsulation body.

Specifically the invention provides a metal clip semiconductor encapsulation comprises:

a lead frame comprising a chip carrier and a plurality of pins in adjacent to the chip carrier;

an upper surface of the chip carrier being provided with a first groove dividing the chip carrier into a first chip mounting area and a second chip mounting area;

a first semiconductor chip having a bottom electrode and a plurality of top electrodes disposed on the first chip mounting area, with its bottom electrode mounted onto the first chip mounting area through a first adhesive, wherein an excessive amount of the first adhesive accumulated at a bottom corner of the first groove near the first chip mounting area;

a second semiconductor chip having a bottom electrode and a plurality of top electrodes disposed on the second chip mounting area, with its bottom electrode mounted onto the second chip mounting area through a second adhesive;

a first metal clip having a first end and a second end, wherein the first end of the first metal clip connecting to a top electrode of the first semiconductor chip, wherein the second end of the first metal clip disposed inside the first groove; and a plastic package for encapsulation of the chip carrier, the pins, the first and second semiconductor chips and the first metal clip.

In one embodiment a bottom of the first groove is removed to isolate the first chip mounting area from the second chip mounting area, a width of the first groove bottom removed is substantially smaller than a width of the first groove.

In another embodiment an excessive amount of the second adhesive accumulated at a bottom corner of the first groove near the second chip mounting area In another embodiment the second end of the first metal clip is disposed inside the first groove close to the second chip mounting area and electrically connected to the second chip mounting area.

In another embodiment the lead frame further comprises a second groove disposed between the chip carrier and at least one of the plurality of the pins, a bottom portion of the second groove being removed for electrically separating the at least one of the plurality of the pins from the chip carrier, wherein a width of the second groove bottom removed being substantially smaller than a width of the second groove.

In another embodiment the package further comprises a second metal clip, wherein a first end of the second metal clip connecting to a top electrode of the second chip and a second end of the second metal clip disposed inside the second groove electrically connecting to the at least one of the plurality of the pins.

In another embodiment an excessive amount of the second adhesive accumulates at a bottom corner of the second groove near the second chip mounting area.

The invention further provides a semiconductor encapsulation comprises:
a lead frame comprising a chip carrier and a plurality of pins;
a first groove disposed between the chip carrier and at least one of the plurality of the pins, wherein a bottom portion of the first groove being removed for electrically separating the at least one of the plurality of the pins from the chip carrier, wherein a width of the first groove bottom removed being substantially smaller than a width of the first groove;
a first semiconductor chip disposed on the chip carrier having a bottom electrode and a plurality of top electrodes, wherein the bottom electrode of the first semiconductor chip connected to the chip carrier through a first conductive adhesive;
a metal connection connecting a top electrode of the first semiconductor chip to the at least one of the plurality of the pins; and
a plastic package for encapsulating the chip carrier, the pins, the chip and the metal connection.

In one embodiment an excessive amount of the second adhesive accumulated at a bottom corner of the first groove near the second chip mounting area.

In another embodiment an upper surface of the chip carrier is provided with a second groove dividing the chip carrier into a first chip mounting area and a second chip mounting area. A bottom of the second groove is removed to isolate the first chip mounting area from the second chip mounting area, wherein a width of the second groove bottom removed is substantially smaller than a width of the second groove.

In another embodiment the first semiconductor chip disposed on the first chip mounting area with its bottom electrode mounted onto the first chip mounting area through a first adhesive, wherein an excessive amount of the first adhesive accumulated at a bottom corner of the first groove near the first chip mounting area.

In another embodiment a second semiconductor chip having a bottom electrode and a plurality of top electrodes disposed on the second chip mounting area, with its bottom electrode mounted onto the second chip mounting area through a second adhesive.

In another embodiment semiconductor package further comprises a metal clip having a first end and a second end, wherein the first end of the second metal clip connecting to a top electrode of the second semiconductor chip and the second end of the second metal clip disposed inside the second groove electrically connecting to the first chip mounting area.

In another embodiment a metal clip having a first end and a second end, wherein the first end of the metal clip connecting to a top electrode of the first semiconductor chip and the second end of the metal clip disposed inside the first groove.

The invention further provides a semiconductor encapsulation method comprises the following steps:
Step 1: providing a lead frame comprising a chip carrier and a plurality of pins in adjacent to the chip carrier with a first groove open from a top surface of the lead frame to a depth shallower than a thickness of the lead frame located between the chip carrier and at least one of the plurality of the pins;
Step 2: disposing a first semiconductor chip having a bottom electrode and a plurality of top electrodes on the chip carrier, connecting the bottom electrode of the first semiconductor chip to the chip carrier through a first conductive adhesive;
Step 3: providing a first metal connection connecting a top electrode of the first semiconductor chip to the at least one of the plurality of the pins
Step 4: providing a plastic package for encapsulating the chip carrier, the pins, the first semiconductor chip and the metal connection; and
Step 5: removing a bottom portion of the first groove so as to electrically isolate the at least one of the plurality of the pins from the chip carrier.

In one embodiment in Step 2 an excessive amount of the first adhesive accumulated at a bottom corner of the first groove near the chip carrier.

In another embodiment the step of providing a metal connection in Step 3 further comprises connecting a first end a first metal clip to a top electrode of the first semiconductor chip and a second end of the first metal clip to the at least one of the plurality of the pins, wherein the second end of the first metal clip being disposed inside the first groove.

In another embodiment in Step 1 the chip carrier is provided with a second groove on an upper surface of the chip carrier dividing the chip carrier into a first chip mounting area and a second chip mounting area.

In another embodiment in Step 2 the first semiconductor chip disposed on the first chip mounting area with its bottom electrode mounted onto the first chip mounting area through a first adhesive, an excessive amount of the first adhesive accumulates at a bottom corner of the first groove near the first chip mounting area.

In another embodiment Step 2 further comprises disposing a second semiconductor chip having a bottom electrode and a plurality of top electrodes on the second chip mounting area, with its bottom electrode mounted onto the second chip mounting area through a second adhesive, wherein an excessive amount of second adhesive accumulated at a bottom corner of the second groove near the second chip mounting area.

In another embodiment Step 3 further provides a second metal connection comprising a metal clip with a first end, connecting to a top electrode of the second chip and a second end disposed inside the second groove.

In another embodiment Step 5 further comprises a step of removing a bottom of the second groove so as to electrically isolate the first chip mounting area from the second chip mounting area, wherein a width of the second groove bottom removed is substantially smaller than a width of the second groove.

The invention further provides a metal clip semiconductor encapsulation method comprises the following steps:
Step 1: providing a lead frame comprising a chip carrier and a plurality of pins, the chip carrier is provided with a first groove open from a top surface of the lead frame to a depth shallower than a thickness of the lead frame dividing the chip carrier into a first chip mounting area and a second chip mounting area; the pins are arranged in adjacent to the chip carrier;
Step 2: disposing a first semiconductor chip having a bottom electrode and a plurality of top electrodes on the first chip mounting area with its bottom electrode mounted onto the first chip mounting area through a first adhesive, wherein an excessive amount of the first adhesive accumulated at a bottom corner of the first groove near the first chip mounting area; disposing a second semiconductor chip having a bottom electrode and a plurality of top electrodes on the second chip mounting area with its bottom electrode mounted onto the second chip mounting area through a second adhesive;

Step 3: providing a first metal clip having a first end and a second end, connecting the first end of the first metal clip onto a top electrode of the first semiconductor chip and the second end of the first metal clip to the second chip mounting area, wherein the second end of the first metal clip disposed inside the first groove;

Step 4: providing a plastic package for encapsulating the chip carrier, the pins, the first and second chips and the first metal clip.

Step 5: removing a bottom of the first groove so as to electrically isolate the first chip mounting area from the second chip mounting area, wherein a width of the first groove bottom removed is substantially smaller than a width of the first groove.

In one embodiment Step 2 further comprises a step of accumulating an excessive amount of the first adhesive at a bottom corner of the first groove near the first chip mounting area.

In another embodiment in Step 1 the lead frame is provided with a second groove disposed between the chip carrier and at least one of the plurality of pins; wherein Step 3 further comprising a step of providing a second metal clip with a first end and a second end, wherein the first end of the second metal clip connecting to a top electrode of the second semiconductor chip and the second end of the second metal clip electrically connecting to the at least one of the plurality of the pins, wherein the second end of the second metal clip being disposed within the second groove.

In another embodiment Step 5 further comprises a step of removing a bottom of the second groove so as to electrically isolate the at least one of the plurality of the pins from the chip carrier, wherein a width of the second groove bottom removed being substantially smaller than a width of the second groove.

DETAILED DESCRIPTION OF SPECIFIC EMBODIMENTS

Embodiment 1

Figure 3:
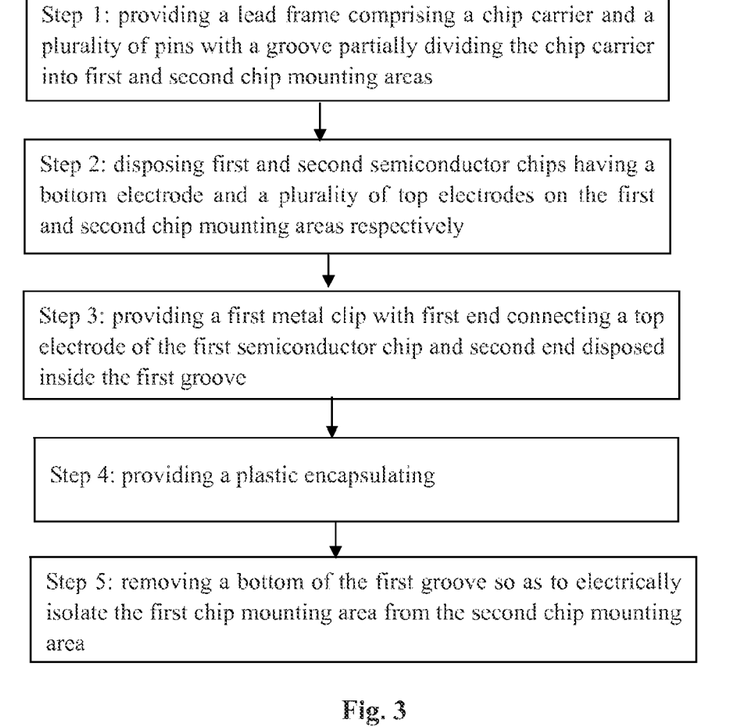
FIG. 3 is a flow chart for a metal clip semiconductor encapsulation method of Embodiment 1.
Figure 4A:
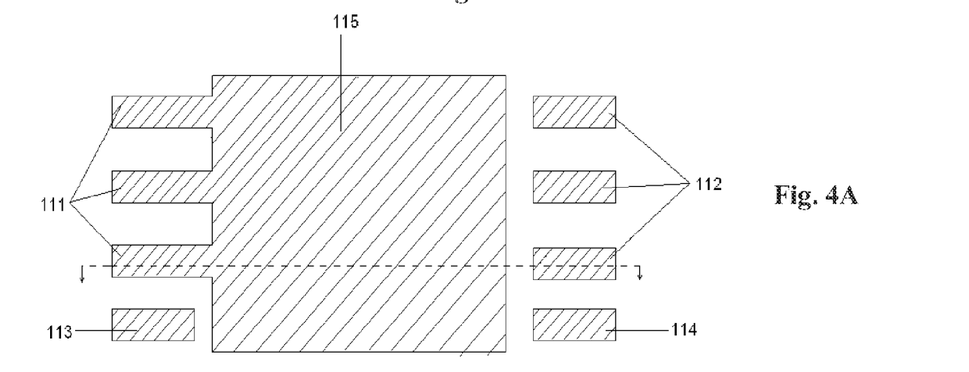
FIGS. 4A and 4B are a top view and a cross-sectional view of a lead frame provided in Embodiment 1.
Figure 4B:
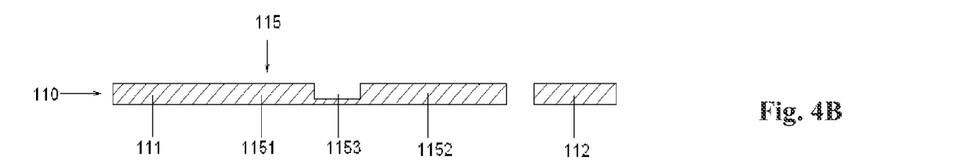

This invention provides a metal clip encapsulation method. The encapsulation structure of the encapsulation method includes a lead frame 110, bonding adhesive 120, chips 130 and 140, a metal clip 150, bond wires 160 and a plastic package body 170. The metal clip semiconductor encapsulation flow chart is as shown in FIG. 3 and the specific encapsulation process thereof is as follows:

As shown in FIGS. 4A and 4B, the lead frame 110 is provided at first and the lead frame 110 comprises a chip carrier 115 and a plurality of pins in adjacent to the chip carrier. FIG. 4A is a top view of the lead frame and FIG. 4B is a cross sectional view along the dotted line position in FIG. 4A. The chip carrier 115 comprises first chip mounting area 1151, second chip mounting area 1152 with a groove 1153 opened from a top surface of the chip carrier disposed between the first and second chip mounting areas dividing the chip carrier into two chip mounting areas. A depth of the groove 1153 is shallower than a thickness of the chip carrier therefore the first and the second chip mounting areas are still connected in the bottom portion of the chip carrier. In actual application, a plurality of chip mounting areas can be arranged on the chip carrier and by dividing the chip carrier with a plurality of grooves. In the embodiment of FIGS. 4A and 4B, only two chip mounting areas and one groove on the lead frame is shown as an example. As shown in the FIG. 4A, the plurality of pins further comprises pin 111, pin 112, pin 113 and pin 114; wherein the pin 111 is connected with the chip carrier 1151, representing that the pin 111 is conductively connected with the bottom electrode of the chip; the pin 112, the pin 113, and the pin 114 are respectively arranged at the two sides of the chip carrier by spacing one interval, and the pins are respectively corresponding to the electrodes of the chips.

Figure 5A:
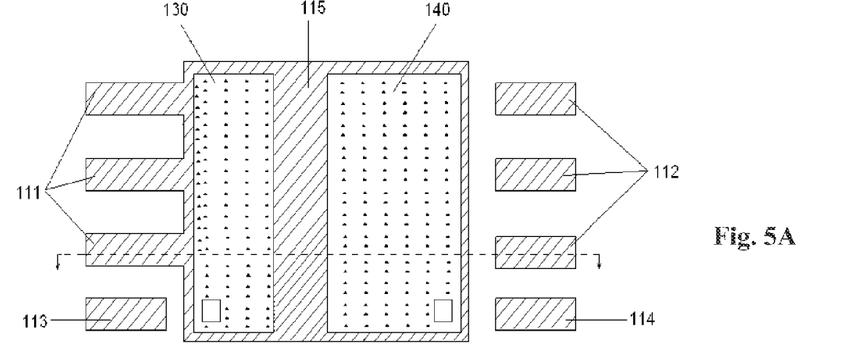
FIGS. 5A and 5B are a top view and a cross-sectional view of arranging the chips on the lead frame through bonding adhesive in Embodiment 1.
Figure 5B:
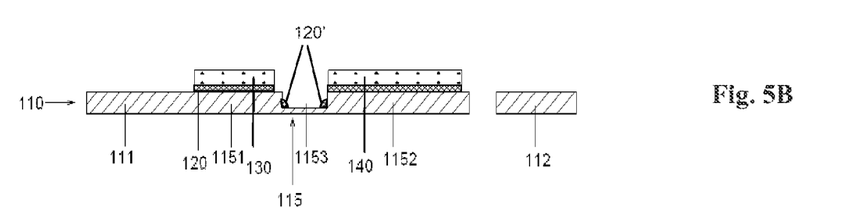

As shown in FIGS. 5A and 5B, as only two chip mounting areas are arranged on the lead frame in the embodiment, two chips are provided. The two chips are respectively a first chip 130 and a second chip 140, In one embodiment, the first chip 130 and the second chip 140 respectively are a high side metallic oxide semiconductor field effect transistor (HS MOSFET) and a low side metallic oxide semiconductor field effect transistor (LS MOSFET). The HS MOSFET and LS MOSFET respectively include a source electrode and a gate electrode at the top surface and a drain electrode at the bottom surface. The chip 130 and the chip 140 are respectively disposed on the first chip mounting area 1151 and the second chip mounting area 1152 through a conductive bonding adhesive 120. A conductive silver paste is preferably selected as the bonding adhesive 120. In a specific process operation, the conductive silver paste is coated on the chip mounting areas at first and then the chips are pressed onto the conductive silver paste. Usually, the conductive silver paste shall overflow on the chip mounting areas; in particular after the chips are disposed on the conductive silver paste, the gravity of the chips shall aggravate the overflowing of the conductive silver paste. In the embodiment, as shown in FIGS. 5A and 5B, the conductive silver paste 120' shall slowly overflow and flow into the groove 1153 accumulated at the bottom corners near the chips respectively. This is different from the prior art in which the chip mounting areas are disconnected, the conductive silver paste would overflow from the chip mounting areas and pass through the gaps between the mounting areas to contaminate the chip mounting equipments supporting the lower surface of the lead frame, therefore a distance between the edges of the chips and the edges of the chip mounting areas must be maintained, which limits the chip size for a given encapsulation sizes. In this embodiment, the bottom corners of the grooves between the chip mounting areas collect overflowed bonding adhesive and prevent the bonding adhesive from flowing onto the chip mounting equipments; the distance from the edges of the chips to the edges of the chip mounting areas can be greatly reduced, from more than 8~10 mils in traditional lead frame, to less than 3 mils. Therefore, the utilization rate of the chip size to the encapsulation body size of this invention is significantly improved. Alternatively, the first chip may be bonded onto the first chip mounting area by a first bonding adhesive with an excessive amount of the first bonding adhesive accumulated at the bottom corner of the groove near the first chip mounting area and the second chip may be bonded to the second mounting area by a second bonding adhesive with an excessive amount of the second bonding adhesive accumulated at the bottom corner of the groove near the second chip mounting area.

Figure 6A:
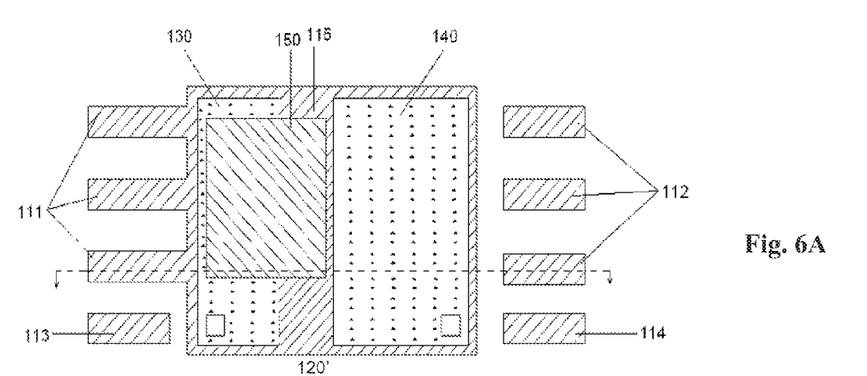
FIGS. 6A and 6B are a top view and a cross-sectional view of using metal clip to link the chip electrodes in Embodiment 1.
Figure 6B:
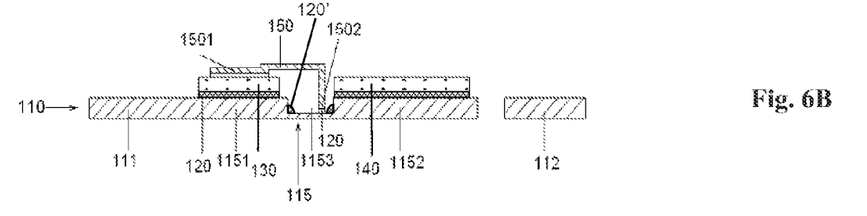

As shown in FIGS. 6A and 6B, after the chips are arranged on the chip mounting areas, one metal clip 150 is provided; a first end 1501 of the metal piece 150 is arranged on the source electrode at the top of the first chip 130 and a second end 1502 of the metal clip is disposed at a position in the carrier groove 153 near the second chip 140. In the prior art encapsulation method shown in FIGS. 2A-2C, as no carrier grooves are provided, the second end 1502 of the metal clip and the second chip 140 must share the same second chip mounting area 1152. In order to prevent the bonding adhesive at the lower part of the second end 1502 of the metal clip 150 and the bonding adhesive at the lower part of the second chip 140 from piling up due to overflowing, and even affecting the circuit performance on the surface of the chip due to the climbing effect of the bonding adhesive surface tension, a certain distance is required between the second end 1502 of the metal clip 150 and the second chip 140. However, in this embodiment, the second end 1502 of the metal clip is disposed inside the carrier groove 1153 which has a certain depth; moreover, with the height of the second chip 140, the possibility that the circuit performances affected by the bonding adhesive climbing onto the surface of the second chip 140 from the lower part of the second end 1502 of the metal clip and from the lower part of the second chip 140 is greatly reduced. Therefore, the distance between the second end 1502 of the metal clip and the second chip 140 can be shortened and the distance between the first chip 130 and the second chip 140 can also be shortened. In one embodiment, the distance from the edge of the first chip to the edge of the second chip is reduced to about 5 mils; while in the traditional encapsulation of FIG. 2A-2C, the distance from the edge of the first chip to the edge of the second chip must be more than 20 mils; thus, the groove structure in this embodiment improves the utilization rate of the chips size in the encapsulation body size and saves cost through the reduction of molding material used in later step. In one embodiment the second end of the clip reaches the edge of the second chip mounting area defining the groove, in another embodiment the second end of the clip remains a distance from the edge of the second chip mounting area defining the groove.

Figure 7A:
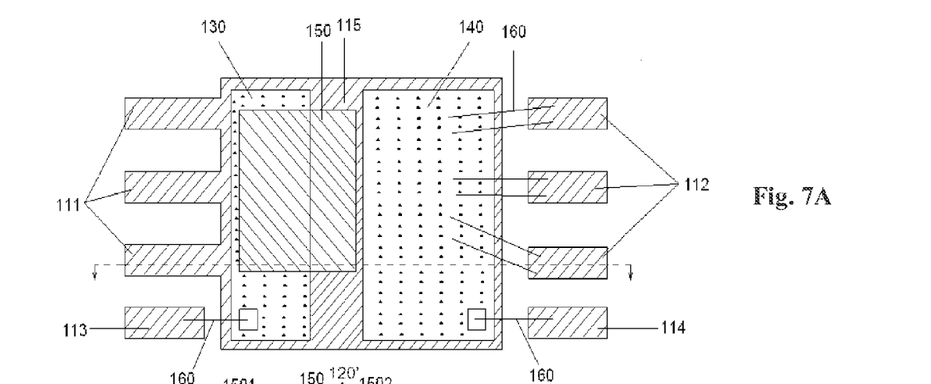
FIGS. 7A and 7B are a top view and a cross-sectional view of using the bond wire to link the chip electrodes and the pins in Embodiment 1.
Figure 7B:
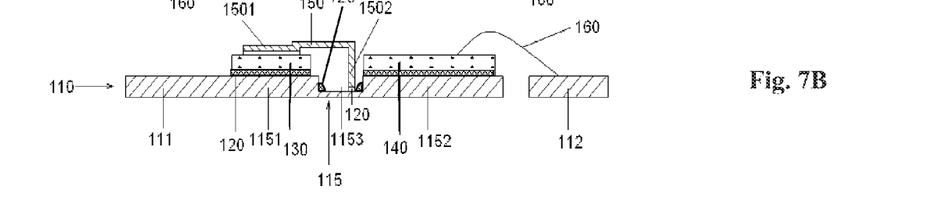

As shown in FIGS. 7A an 7B, a bond wires 160 are provided to connect the other chip electrodes; the first chip 130 and the pin 111 are conductively connected; the gate electrode at the top of the first chip 130 is connected to the pin 113 through the bond wire 160; the source electrode at the top of the second chip 140 is connected to the pin 112 through the bond wire 160; and the gate electrode at the top of the second chip 140 is connected with the pin 114 through the bond wire 160.

Figure 8A:
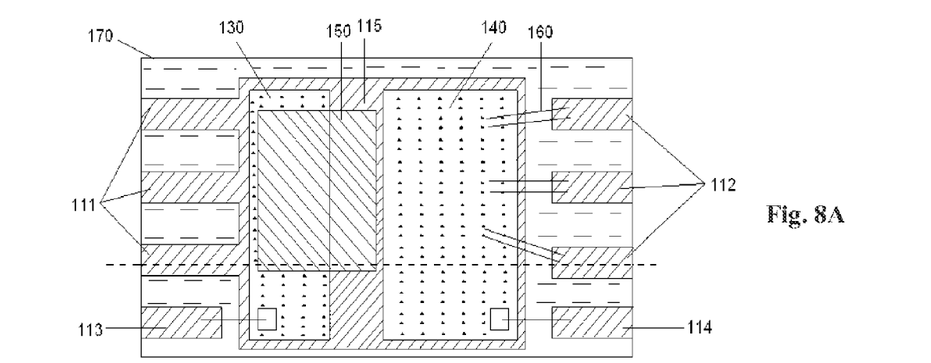
FIGS. 8A and 8B are a top view and a cross-sectional view plastically packaged by the plastic package body in Embodiment 1.
Figure 8B:
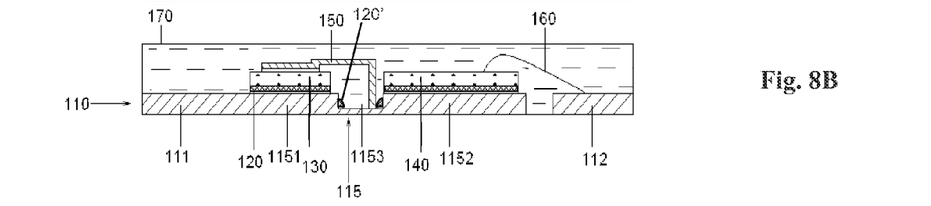

As shown in FIGS. 8A and 8B, after the bond wire connection is finished, a plastic package body 170 is adopted to implement encapsulation on the encapsulation structure.

Figure 9A:
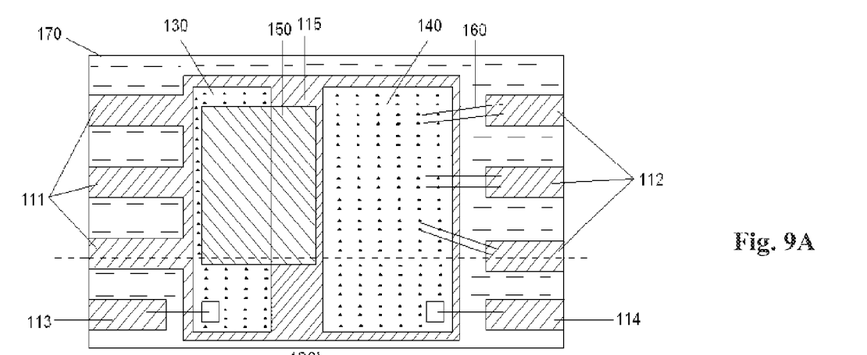
FIGS. 9A and 9B are a top view and a cross-sectional view of cutting off the bottom surface of the carrier groove at the bottom of the plastic package body in Embodiment 1.
Figure 9B:
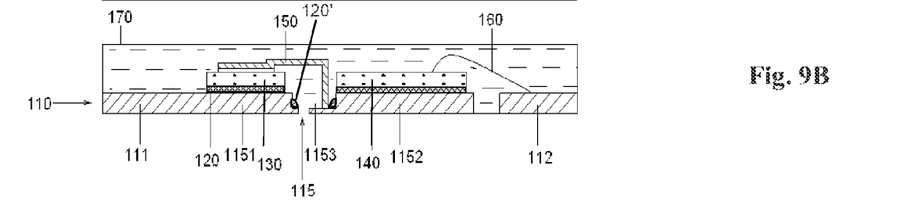

As shown in FIGS. 9A and 9B, after the encapsulation is finished, a bottom portion of the carrier groove 1153 is removed from the bottom of the plastic package body 170 by cutting off or by etching, thereby electrically isolate the first chip mounting area 1151 and the second chip mounting area 1152 so as to finish the encapsulation of chips. Preferably a width of the bottom portion of the carrier groove removed is smaller than a width of the groove itself for leaving space to accommodate the second end 1502 of the clip 150 inside the groove and electrically connecting to the second chip mounting area.

Embodiment 2

Figure 10:
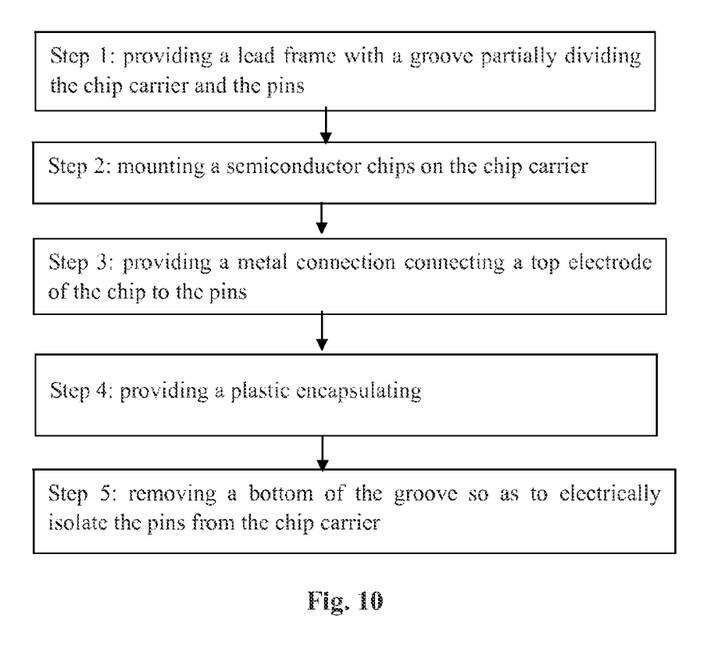
FIG. 10 is a flow chart of the metal clip semiconductor encapsulation method of Embodiment 2.
Figure 11A:
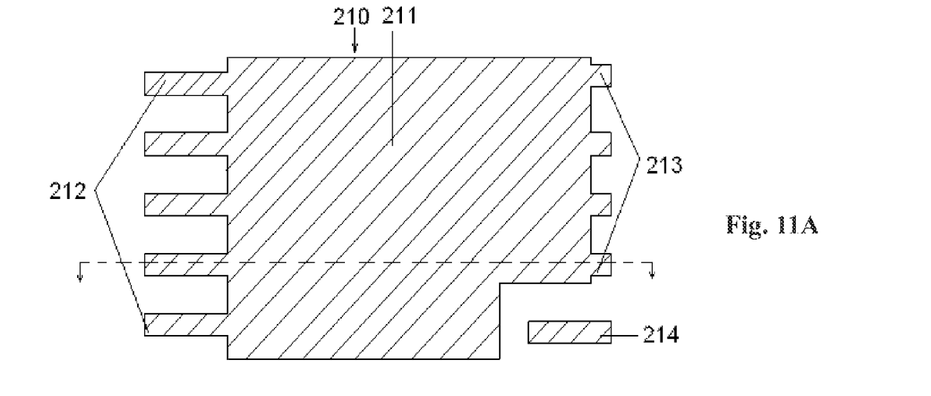
FIGS. 11A and 11B are a top view and a cross-sectional view of the lead frame provided in Embodiment 2.
Figure 11B:
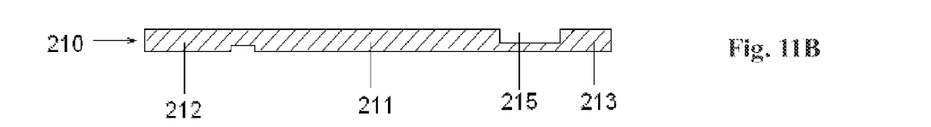

This invention provides a metal clip encapsulation method. The encapsulation structure includes a lead frame 210, bonding adhesive 220, a chip 230, a metal clip 240, a bond wire 250 and a plastic package body 260. The flow chart of the semiconductor encapsulation method flow chart is as shown in the FIG. 10 and the specific encapsulation step thereof is as follows:

As shown in FIGS. 11A and 11B, the lead frame 210 comprises a plurality of pins and a chip carrier 211. The pins include two groups of pins 212 and 213 which are connected together with the chip carrier 211 and are respectively disposed at two opposite sides of the chip carrier 211. A pin 214 is disconnected from the chip carrier 211. As shown in the FIG. 11B, a groove 215 is disposed on top surface of the lead frame between the chip carrier 211 and the pin 213 dividing the chip carrier 211 and the pin 213 on the top portion of the lead frame. A depth of the groove 215 is shallower than a thickness of the lead frame therefore the chip carrier 211 and the pin 213 are connected at the bottom portion of the lead frame.

Figures 12A, 12B:
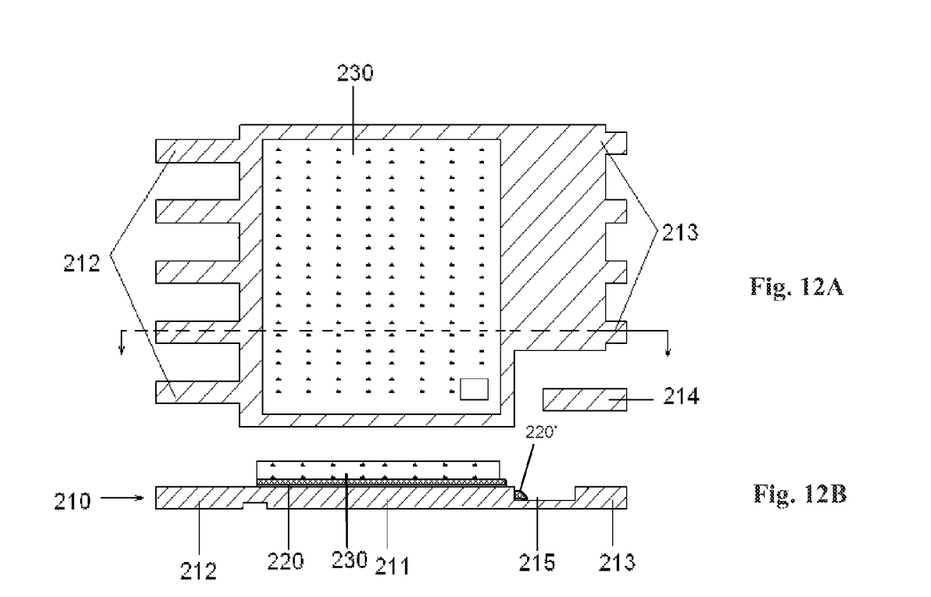
FIGS. 12A and 12B are a top view and a cross-sectional view of arranging the chips on the lead frame in Embodiment 2.

As shown in FIGS. 12A and 12B, one chip 230 is provided; the chip 230 is disposed on the chip carrier 211 through bonding adhesive 220; the overflowed bonding adhesive 220' can flow into the groove 215 accumulating at the bottom corner near the chip carrier, thereby avoiding the contamination to the chip mounting equipment. The edge of the chip 230 can also approach to the edge of the chip carrier 211 as close as possible. In one embodiment, chip 230 is a power metallic oxide semiconductor field effect transistor (MOSFET) having a source electrode and a gate electrode on the top and a drain electrode on the bottom with the drain bottom electrode connected to the chip carrier of the lead frame.

Figure 13A:
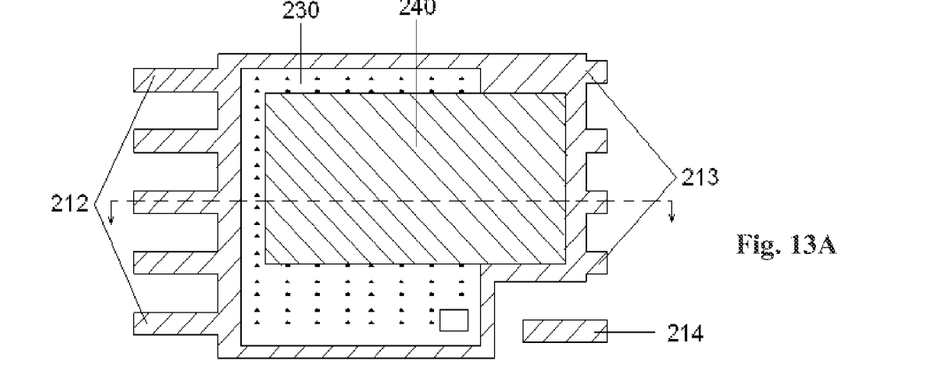
FIGS. 13A and 13B are a top view and a cross-sectional view of using metal clip to link the chip electrodes and the pins in Embodiment 2.
Figure 13B:
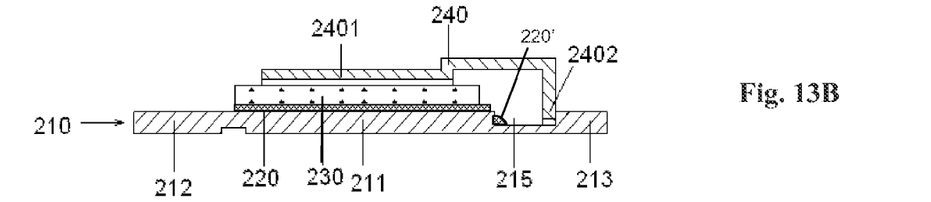

As shown in FIGS. 13A and 13B, the metal clip 240 is used to connect the top electrodes of the chips and the pins; take a power metallic oxide semiconductor field effect transistor (MOSFET) as an example, a first end 2401 of the metal clip 240 is connected onto the source electrode at the top of the chip and a second end 2402 of the metal clip 240 is disposed inside the groove at a location near the pin and is electrically connected to the pin. In one embodiment the second end of the clip reaches the edge of the pin defining the groove, in another embodiment the second end of the clip remains a distance from the edge of the pin defining the groove. Alternatively, bond wires or ribbon wires can replace metal clip 240 to connect the source electrode on the chip top surface to the pins.

Figure 14A:
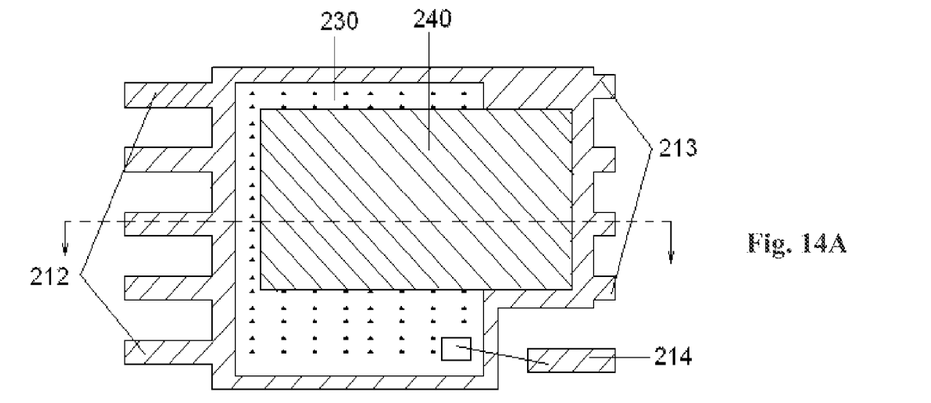
FIGS. 14A and 14B are a top view and a cross-sectional view of using the bond wire to link the chip electrodes and the pins in Embodiment 2.
Figure 14B:
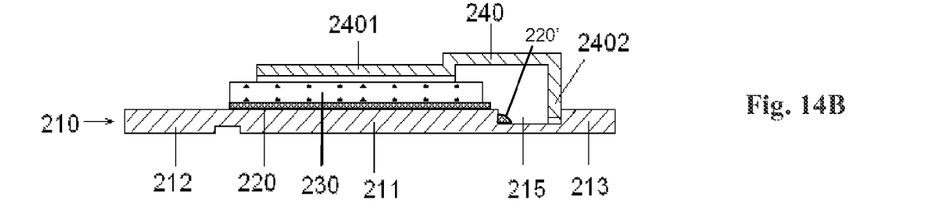
Figure 15A:
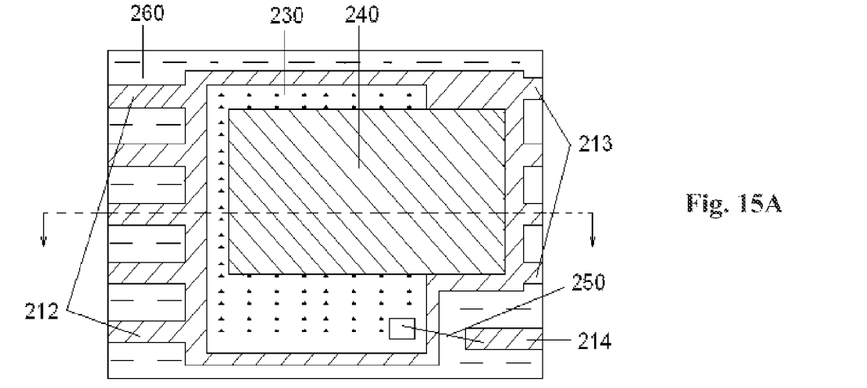
FIGS. 15A and 15B are a top view and a cross-sectional view of a plastically encapsulation package body in Embodiment 2.
Figure 15B:
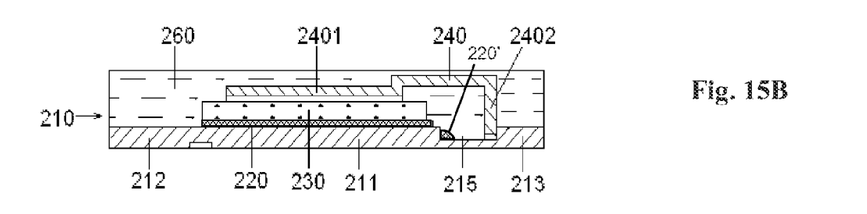
Figure 16A:
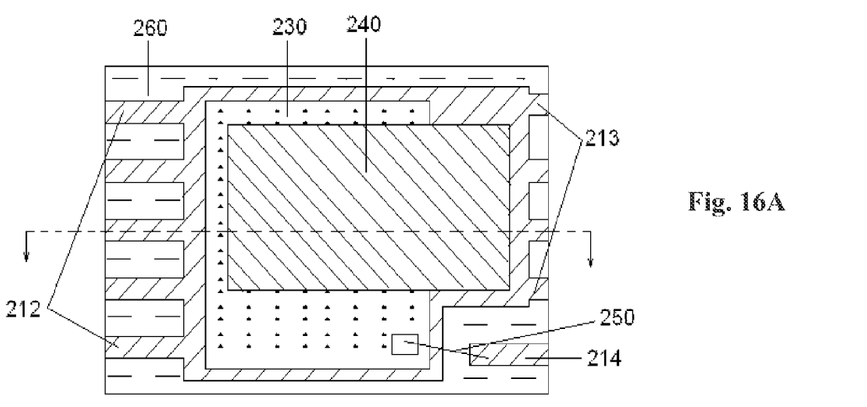
FIGS. 16A and 16B are a top view and a cross-sectional view of removing a bottom portion of the groove at the bottom of the plastic package body in Embodiment 2.
Figure 16B:
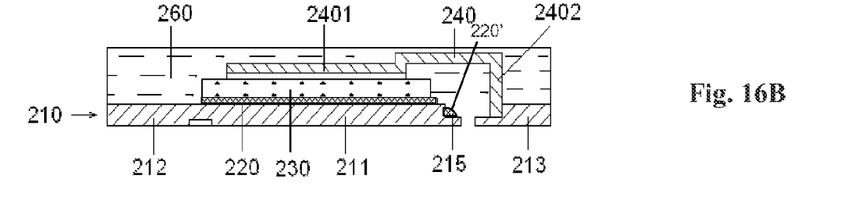

As shown in FIGS. 14A and 14B, a bond wire 250 is used to connect the gate electrode at the top of the chip 230 and the pin 214. Alternatively a second metal can be used to connect the gate of chip 230 to the pin 214. As shown in FIGS. 15A and 15B, the plastic package body 260 is then used to plastically encapsulate the lead frame, the chip, the metal clip and the pins. After the plastic package is finished as shown in the FIGS. 16A and 16B, a bottom portion of the groove 215 is removed at the bottom of the plastic package body, thereby isolating the connection between the chip carrier 211 and the pin 213 so as to finish the whole encapsulation process. In this embodiment, the chip carrier and the pins are connected together before plastic encapsulation with a groove disposed between the pins and the carrier protecting the chip mounting equipment from being contaminated by the bonding adhesive, thereby allows the reduction of the distance between the chip carrier and the pins and improves the utilization rate of the chip size in encapsulation.

Embodiment 3

Figure 17:
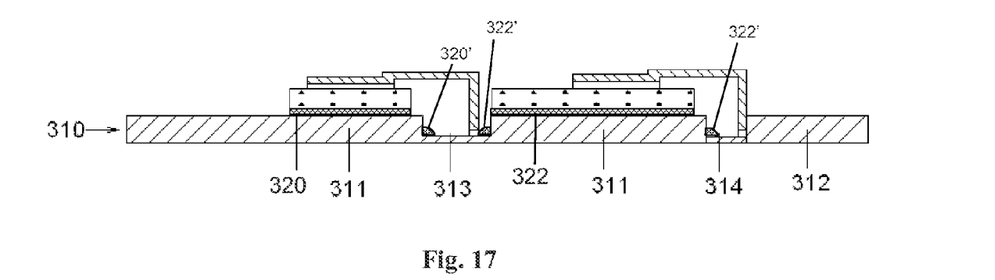
FIG. 17 is the cross-sectional view of a metal clip semiconductor encapsulation structure of Embodiment 3.

Embodiment 1 as described above utilizes a lead frame of connected chip mounting areas on a chip carrier partially divided by a groove before plastic encapsulation and then isolate each chip mounting area by removing a portion of the groove bottom after the encapsulation is finished. On the other hand embodiment 2 utilize a lead frame with connected chip carrier and pins partially divided by a groove before plastic encapsulation and then isolate the chip mounting area and the pins by removing a portion of the groove bottom after encapsulation. This embodiment 3 combines the features of Embodiment 1 and Embodiment 2. As shown in the FIG. 17, metal clips are used to replace the bond wires to connect the chip electrodes and the pins. Multiple chip mounting areas on chip carrier 311 in the lead frame 310 and the pins 312 are all connected together at the bottom portion of the lead frame with a plurality of grooves partially dividing the chip mounting areas and pins from the chip carrier. Specifically groove 313 partially divides the chip carrier into a first chip mounting area and a second chip mounting area, groove 314 partially divides the carrier and the pins. After a first chip and a second chip are mounted on the first chip mounting area and the second chip mounting area respectively using a first bonding adhesive 320 and second bonding adhesive 322, excessive amount of first bonding adhesive 320' may be accumulated at the bottom corners in grooves near the first chip mounting area and excessive amount of the second bonding adhesive 322' may be accumulated at the bottom corners of the grooves near the second chip mounting area. First and second clips each has a first end connected to a top electrode of a chip and a second end disposed inside a groove. After plastic encapsulation, a portion of each groove bottom is removed to electrically isolate the chip mounting areas and the pins. A width of the bottom of the groove removed is smaller than a width of the groove.

While the above is a complete description of the preferred embodiment of the present invention, it is possible to use various alternatives, modifications and equivalents. Although the specification uses MOSFET chips as an example, the package method is applicable to other types of semiconductor chips or their combinations with or without bottom electrode. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

We claim:

1. A semiconductor encapsulation method comprises the following steps:
    Step 1: providing a lead frame comprising a chip carrier and a plurality of pins adjacent to the chip carrier with a first groove open from a top surface of the lead frame to a depth shallower than a thickness of the lead frame located between the chip carrier and at least one of the plurality of the pins;
    Step 2: disposing a first semiconductor chip having a plurality of top electrodes on the chip carrier, connecting a bottom of the first semiconductor chip to the chip carrier through a first adhesive;
    Step 3: providing a first metal connection connecting a top electrode of the first semiconductor chip to the at least one of the plurality of the pins;
    Step 4: providing a plastic package for at least partially encapsulating the chip carrier, the pins, the first semiconductor chip and the metal connection; and
    Step 5: removing a bottom portion of the first groove so as to electrically isolate the at least one of the plurality of the pins from the chip carrier;
    wherein the step of providing a first metal connection in Step 3 further comprises connecting a first end a first metal clip to a top electrode of the first semiconductor chip and a second end of the first metal clip to the at least one of the plurality of the pins, wherein the second end of the first metal clip being disposed inside the first groove.

2. The semiconductor encapsulation method of claim 1, wherein in Step 2 an excessive amount of the first adhesive accumulated at a bottom corner of the first groove near the chip carrier.

3. The semiconductor encapsulation method of claim 1 wherein in Step 1 the chip carrier is provided with a second groove on an upper surface of the chip carrier dividing the chip carrier into a first chip mounting area and a second chip mounting area.

4. The semiconductor encapsulation method of claim 1 wherein in Step 2 the first semiconductor chip disposed on the first chip mounting area with a bottom electrode mounted onto the first chip mounting area through a conductive adhesive, an excessive amount of the conductive adhesive accumulates at a bottom corner of the first groove near the first chip mounting area.

5. The semiconductor encapsulation method of claim 1 wherein Step 2 further comprises disposing a second semiconductor chip having a plurality of top electrodes on the second chip mounting area, with a bottom mounted onto the second chip mounting area through a second adhesive, wherein an excessive amount of second adhesive accumulated at a bottom corner of the second groove near the second chip mounting area.

6. A semiconductor encapsulation method comprises the following steps:
   Step 1: providing a lead frame comprising a chip carrier and a plurality of pins adjacent to the chip carrier with a first groove open from a top surface of the lead frame to a depth shallower than a thickness of the lead frame located between the chip carrier and at least one of the plurality of the pins;
   Step 2: disposing a first semiconductor chip having a plurality of top electrodes on the chip carrier, connecting a bottom of the first semiconductor chip to the chip carrier through a first adhesive;
   Step 3: providing a first metal connection connecting a top electrode of the first semiconductor chip to the at least one of the plurality of pins;
   Step 4: providing a plastic package for at least partially encapsulating the chip carrier, the pins, the first semiconductor chip and the metal connection; and
   Step 5: removing a bottom portion of the first groove so as to electrically isolate the at least one of the plurality of the pins from the chip carrier;
   wherein in Step 1 providing the chip carrier comprises providing it with a second groove on an upper surface of the chip carrier dividing the chip carrier into a first chip mounting area and a second chip mounting area;
   wherein Step 2 further comprises disposing a second semiconductor chip having a plurality of top electrodes on the second chip mounting area, with a bottom mounted onto the second chip mounting area through a second adhesive; and
   wherein Step 3 further provides a second metal connection comprising a metal clip with a first end connecting to a top electrode of the second chip and a second end disposed inside the second groove.

7. The semiconductor encapsulation method of claim 6 wherein Step 5 further comprises a step of removing a bottom of the second groove so as to electrically isolate the first chip mounting area from the second chip mounting area, wherein a width of the second groove bottom removed is substantially smaller than a width of the second groove.

8. A metal clip semiconductor encapsulation method comprises the following steps:
   Step 1: providing a lead frame comprising a chip carrier and a plurality of pins; the chip carrier is provided with a first groove open from a top surface of the lead frame to a depth shallower than a thickness of the lead frame dividing the chip carrier into a first chip mounting area and a second chip mounting area; the pins are arranged in adjacent to the chip carrier;
   Step 2: disposing a first semiconductor chip having a bottom electrode and a plurality of top electrodes on the first chip mounting area with its bottom electrode mounted onto the first chip mounting area through a first adhesive, wherein an excessive amount of the first adhesive accumulated at a bottom corner of the first groove near the first chip mounting area;
   disposing a second semiconductor chip having a bottom electrode and a plurality of top electrodes on the second chip mounting area with its bottom electrode mounted onto the second chip mounting area through a second adhesive;
   Step 3: providing a first metal clip having a first end and a second end, connecting the first end of the first metal clip onto a top electrode of the first semiconductor chip and the second end of the first metal clip to the second chip mounting area, wherein the second end of the first metal clip disposed inside the first groove;
   Step 4: providing a plastic package for encapsulating the chip carrier, the pins, the first and second chips and the first metal clip; and
   Step 5: removing a bottom of the first groove so as to electrically isolate the first chip mounting area from the second chip mounting area, wherein a width of the first groove bottom removed is substantially smaller than a width of the first groove.

9. The metal clip semiconductor encapsulation method of claim 8, wherein Step 2 further comprising a step of accumulating an excessive amount of the first adhesive at a bottom corner of the first groove near the first chip mounting area.

10. The metal clip semiconductor encapsulation method of claim 8 wherein in Step 1 the lead frame is provided with a second groove disposed between the chip carrier and at least one of the plurality of the pins; wherein Step 3 further comprising a step of providing a second metal clip with a first end and a second end, wherein the first end of the second metal clip connecting to a top electrode of the second semiconductor chip and the second end of the second metal clip electrically connecting to the at least one of the plurality of the pins, wherein the second end of the second metal clip being disposed within the second groove.

11. The metal clip semiconductor encapsulation method of claim 10 wherein Step 5 further comprises a step of removing a bottom of the second groove so as to electrically isolate the at least one of the plurality of the pins from the chip carrier, wherein a width of the second groove bottom removed being substantially smaller than a width of the second groove.

* * * * *